United States Patent [19]
Bonnet et al.

[11] Patent Number: 5,275,714
[45] Date of Patent: Jan. 4, 1994

[54] METHOD OF PRODUCING AN ABSORBER LAYER FOR SOLAR CELLS WITH THE AID OF ELECTRODEPOSITION

[75] Inventors: Dieter Bonnet, Friedrichsdorf; Josef Ehrhardt, Hochheim/Main; Gert Hewig, Alzenau, all of Fed. Rep. of Germany

[73] Assignee: Battelle Memorial Institute, Carouge, Switzerland

[21] Appl. No.: 852,200

[22] PCT Filed: Sep. 9, 1991

[86] PCT No.: PCT/EP91/01708
§ 371 Date: Jun. 30, 1992
§ 102(e) Date: Jun. 30, 1992

[87] PCT Pub. No.: WO92/05586
PCT Pub. Date: Apr. 2, 1992

[30] Foreign Application Priority Data
Sep. 22, 1990 [DE] Fed. Rep. of Germany ....... 4030057
Feb. 4, 1991 [DE] Fed. Rep. of Germany ....... 4103291

[51] Int. Cl.⁵ .................... C25D 5/50; C25D 9/08; C25D 15/02; H01L 31/18
[52] U.S. Cl. ................... 205/109; 136/265; 136/264; 205/138; 205/144; 205/227; 205/239; 205/316; 205/915; 205/923; 437/5
[58] Field of Search ............... 205/109, 138, 144, 224, 205/227-228; 136/265, 264; 437/5; 427/76

[56] References Cited

FOREIGN PATENT DOCUMENTS

| | | |
|---|---|---|
| 0206585A2 | 12/1986 | European Pat. Off. ........... 136/265 |
| 0297799A1 | 1/1989 | European Pat. Off. ........... 205/123 |
| 0318315A2 | 5/1989 | European Pat. Off. ............ 437/5 |
| 0360403A2 | 3/1990 | European Pat. Off. ........... 136/265 |
| 3822073A1 | 1/1990 | Fed. Rep. of Germany ........ 437/5 |

OTHER PUBLICATIONS

F. J. Pern et al., *Solar Cells,* vol. 24, May/Jun. 1988, pp. 81–90.
I. Shih et al., *Solar Cells,* vol. 16, Jan./Feb. 1986, pp. 283–287.
F. J. Pern et al., *Conference Record,* 19th IEEE Photovoltaic Specialists Conf. (May 1987), pp. 1295–1298.
*Solar Cells,* vol. 16 (1986); "Electrodeposition of $CuInSe_2$ and $CuInS_2$ Films", Gary Hodes et al., pp. 245–254.
C. D. Lokhande, "Pulse Plated Electrodeposition of $CuInSe_2$ Films", J. Electrochem. Soc: *Electrochemical Science and Technology,* vol. 134, No. 7, Jul. 1987, pp. 1727–1729.
R. N. Bhattacharya et al., "Electrodeposition of CuInX (X=Se, Te) Thin Films", *Solar Cells,* vol. 16, (1986), pp. 237–243.

*Primary Examiner*—Aaron Weisstuch
*Attorney, Agent, or Firm*—Spencer, Frank & Schneider

[57] ABSTRACT

A method of producing an absorber layer for solar cells by electrolytic dispersion deposition.

12 Claims, 1 Drawing Sheet

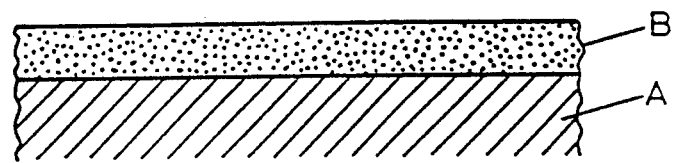

METHOD OF PRODUCING AN ABSORBER LAYER FOR SOLAR CELLS WITH THE AID OF ELECTRODEPOSITION

FIELD OF THE INVENTION

The invention relates to a method of producing an absorber layer for solar cells, particularly a $CuInSe_2$ absorber layer, with the aid of electrodeposition, wherein a ternary semiconductor layer composed of elements of Groups IB, IIIA, and VIA of the Periodic Table of Elements is deposited on an electrically conductive substrate.

TECHNOLOGY REVIEW

A $CuInSe_2$ thin-film solar cell is typically composed of a substrate which gives the cell the necessary stability. The substrate is coated with the above-mentioned absorber layer, which in the literature is also called an absorber-generator. Customarily, a large-area metal current pickup contact is disposed between the substrate and the absorber layer. The collector, with the aid of which the pn-junction is produced, is disposed on the top face of the absorber layer. In the example of a $CuInSe_2$ absorber layer the collector is composed of a coating of CdS. Customarily, a more or less fine grid contact is applied to the top face of the collector so as to reduce series resistance. The above relates to the general structure of a thin-film solar cell as it is constructed with the aid of the absorber layer produced according to the method of the invention.

Several complicated, usually physical, processes are available for the manufacture of such absorber layers and, among these processes, the production process employing electrodeposition technology promises to be particularly economical and environmentally friendly. Therefore, the present invention concerns itself with this technology.

At present, a solar cell whose absorber layer is composed of $CuInSe_2$ appears to hold the greatest promise for success. However, the production of such an absorber layer by electroplating has failed in the past, although it was possible to precipitate layers composed of $CuInSe_2$ from acidic Cu-chloride, In-chloride, and Se-oxide containing baths. Such ternary baths, however, are unstable and can therefore not be considered for economical manufacture.

Regarding the prior art, reference is made to
R. N. Bhattacharya, *Solar Cells*, Vol. 16 (1986) 237–243;
G. Hodes, *Solar Cells.* Vol. 16 (1986) 245–254;
C. D. Lokhande, *J. Electrochem. Soc.*, Vol. 134 (1987) 1727–1729.

SUMMARY OF THE INVENTION

The invention provides a method of producing an absorber layer of a ternary alloy for solar cells with the aid of electrodeposition, wherein a binary alloy is deposited on a substrate from a solution of ions of the elements of Groups IB and IIIA of the Periodic Table of Elements and simultaneously an ultrafine powder of an element of Group VIA of the Periodic Table of Elements that is suspended in the electrolytic bath is incorporated into the alloy in a finely dispersed manner by means of dispersion electrolysis. A subsequent, for example, thermochemical reaction leads to a chemical compound of the $I-III-VI_2$ type.

With this manner of proceeding, difficulties are avoided as they occurred in the prior art particularly during the electrodepoition of $CuInSe_2$ caused, in particular, by the instability of the ternary baths. Instead, advantage is taken of the fact that binary CuIn layers can easily be deposited electrolytically into which Se is embedded according to the invention in a finely dispersed form by dispersion electrolysis.

BRIEF DESCRIPTION OF THE FIGURE

The FIGURE is a schematic representation of a copper-indium-selenium dispersion layer (B) that has been deposited by dispersion electrolysis on an electrically conductive substrate (A).

DETAILED DESCRIPTION OF THE INVENTION

This is accomplished according to the invention in that a binary alloy of elements of Groups IB and IIIA of the Periodic Table of Elements is electrodeposited on the substrate simultaneously with the alloy component of Group VIA of the Periodic Table of Elements that is suspended in the electroplating bath; it is incorporated in the binary alloy in finely dispersed form by means of dispersion electrolysis.

The invention thus takes advantage of the realization that binary CuIn layers can easily be deposited electrolytically. The incorporation of selenium—and in general the respective Group VIA element of the Periodic Table of Elements—takes place according to the invention by dispersion electrolysis, thus avoiding the drawbacks of the prior art; in particular, the procedure of depositing from an unstable ternary bath is no longer employed.

The process sequence according to the invention maintains the advantage of a one-step electroplating deposition process, particularly the high degree of material utilization with a large throughput, due to it being possible to coat several substrates in parallel and to coat the substrates continuously. Moreover, the absorber layers can be precipitated on any desired metal substrate without subsequent environmentally damaging selenide formation.

It should be mentioned that Cu and In are given merely as examples of elements of Groups IB and VIA of the Periodic Table of Elements and selenium is given merely as an example of an element of Group VIA of the Periodic Table of Elements. In principle, however, all other elements of these groups are applicable for the process according to the invention.

According to the invention, for example, a binary CuIn alloy is electrolytically deposited on a metal substrate. Each component of the binary alloy may be present between about 25% and 75% (volume percentages). At the same time, on the basis of the principle of dispersion electrolysis, fine Se particles suspended in the electrolyte are embedded in a finely dispersed manner in the developing CuIn layer so that, after, for example, a thermochemical reaction of the components, the resulting end product is a ternary $CuInSe_2$ alloy, that is, the desired absorber layer. The volume percentage of the third component incorporated in the binary alloy by dispersion electrolysis is between about 25% and 70%. The concentration of the third component, when suspended in the electrolyte, is between about 10 to 500 g/l.

If the process is implemented by electroplating of a moving band, the continuous production of absorber layers is possible at an industrial scale. The incorporation of Se can be effected at vertically as well as horizontally disposed cathodes. A very high incorporation of Se can be realized with a horizontal cathode by utilizing the sedimentation effect. To increase the incorporation of Se into the binary alloy, the Se particles may also be conditioned by heavy monovalent metal ions (e.g. cesium ions) or by surfactants. Moreover, in order to realize an optimum layer composition in the precipitation, it is possible to employ ultrasound, jet plating, and/or pulse plating.

To produce an optimum crystal structure and surface morphology for photovoltaic energy conversion, the CuInSe$_2$ dispersion layer, here given as an example, may be subjected to a diffusion and crystallization heat treatment. The Se powders employed according to the invention may be brought to the required fineness by grinding and sorting of commercial powders; or they may be produced by reduction of selenic acid with sulfur dioxide and may be brought into the hexagonally crystallized form required for semiconductors by heat treatment.

Thus the process according to the invention permits the production of absorber layers at an industrial scale by means of dispersion electrolysis in a simple and environmentally safe manner.

Since the thickness of the absorber layer is customarily several $\mu$m, it is necessary to employ, for example, a very fine selenium powder. In addition to the customary procedures of grinding with subsequent sorting, this may also be accomplished by the reduction of selenic acid with sulfur dioxide, which also produces a powder having a grain size in the order of magnitude of less than 1 $\mu$m.

The Se powder may be brought into the hexagonal crystal form which is particularly advantageous for the production of solar cells by a heat treatment.

The photovoltaic properties of the absorption layer may be improved by subjecting the coated substrate to diffusion heating.

EXAMPLE

An embodiment of the process according to the invention will now be described.

From a galvanic bath based on sulfamate and including 0.5 mol/l Cu and 0.01 mol/l In in which 50 g/l Se powder were suspended, a contiguous CuInSe layer was deposited to a thickness of 10 $\mu$m at a current density of 3 A/dm$^2$; it adhered well to the substrate and had the following composition:

Cu = 20.5 weight %;
In = 44.1 weight %; and
Se = 35.4 weight %.

The In and Se contents of the deposits employed in this embodiment can easily be varied, for example in such a way that the Se content is increased and the In content is reduced. Instead of a sulfamate bath, other bath types are also possible, for example those based on chloride, cyanide, and sulfate.

We claim:

1. A method of producing a ternary semiconductor absorber layer for solar cells, comprising:
   electrolytically depositing a binary alloy of elements of Groups IB and IIIA on an electrically conductive substrate in an electroplating bath and simultaneously incorporating a third alloy component of Group VIA suspended in the electroplating bath in finely dispersed form by dispersion electrolysis, and
   producing a ternary semiconductor layer of the type IB-IIIA-VIA by heat treating the deposited material.

2. The method according to claim 1, wherein the volume percentage of each component of the binary alloy is between about 25% and 75%.

3. The method according to claim 1, wherein the volume percentage of the third alloy component incorporated in the binary alloy by dispersion electrolysis is between about 25% and 70%.

4. The method according to claim 1, wherein the dispersion electrolysis takes place with the use of pulse plating, jet plating, and/or ultrasound.

5. The method according to claim 1, wherein the deposition of the alloy component suspended in the electroplating bath is aided by sedimentation.

6. The method according to claim 1, wherein the deposition takes place continuously by electroplating of a moving band.

7. The method according to claim 1, wherein the concentration of the third alloy component that is suspended in the electrolyte and is to be embedded is about 10 to 500 g/l.

8. The method according to claim 1, wherein the third alloy component to be embedded is conditioned with surface-active substances.

9. The method according to claim 1, wherein the third alloy component to be embedded is produced by grinding and sorting.

10. The method according to claim 1, wherein Se is employed as the third alloy component to be embedded, and the Se is produced by the reduction of selenic acid with sulfur dioxide.

11. The method according to claim 1, wherein Se is employed as the third alloy component to be embedded, said Se having been brought into a semiconductor hexagonal crystal shape by means of a heat treatment.

12. The method according to claim 1, wherein the coating of the substrate is subjected to diffusion heating.

* * * * *